United States Patent [19]

Ferguson et al.

[11] Patent Number: 5,015,953

[45] Date of Patent: May 14, 1991

[54] MAGNETOMETER FOR DETECTING DC MAGNETIC FIELD VARIATIONS

[75] Inventors: Lucian G. Ferguson, Largo; Lincoln H. Charlot, Jr., St. Petersburg, both of Fla.

[73] Assignee: Security Tag Systems, Inc., St. Petersburg, Fla.

[21] Appl. No.: 891,379

[22] Filed: Jul. 31, 1986

[51] Int. Cl.$^5$ ............................................. G01R 33/02
[52] U.S. Cl. ................................... 324/244; 324/209
[58] Field of Search ............... 324/209, 244, 249, 259, 324/260–262

[56] References Cited

U.S. PATENT DOCUMENTS

| | | | |
|---|---|---|---|
| 2,334,593 | 11/1943 | Wychoff | 324/244 |
| 2,474,693 | 6/1949 | Rowe | 324/244 |
| 3,443,213 | 6/1969 | Bader et al. | |
| 3,461,387 | 8/1969 | Morris et al. | |
| 3,488,587 | 1/1970 | Sparrow | 324/244 X |
| 4,298,862 | 11/1981 | Gregor et al. | 340/572 |
| 4,310,798 | 1/1982 | Brunsch et al. | 324/209 |
| 4,484,184 | 11/1984 | Gregor et al. | 340/572 |
| 4,495,487 | 1/1985 | Kavesh et al. | 340/572 |
| 4,510,489 | 4/1985 | Anderson, III et al. | 340/572 |
| 4,510,490 | 4/1985 | Anderson, III et al. | 340/572 |
| 4,553,136 | 11/1985 | Anderson, III et al. | 340/572 |
| 4,591,788 | 5/1986 | Mohri et al. | 324/244 X |
| 4,648,041 | 3/1987 | Tarr | 324/228 X |

FOREIGN PATENT DOCUMENTS 0011724 6/1980 European Pat. Off.
0092371 10/1983 European Pat. Off.

OTHER PUBLICATIONS

Narita et al., "Measurement of Saturation Magnetostriction of a Thin Amorphous Ribbon ...", *IEEE Trans on Magnetics*, vol. 1, May. 16, No. 2, 3/80, pp. 435–439.

McVey, "Parallel LC Circuit Design for Specific Harmonic Attenuation", *Conference Proceedings IEEE Southeastcon '85*, 3/31–4/3/85, pp. 338–340.

Kinnard, "Applied Electrical Measurements", Wiley, 1956, pp. 284–290.

Mitchell et al, "Magnetoelastic Effects in $FE_{71}Co_9B_{20}$ Glassy Ribbons", *J. Appl. Phys.* 50 (3), Mar. 1979, pp. 1627–1628.

Modzelewski et al, "Magnetomechanical Coupling and Permeability in Transversely Annealed Metglas 2605 Alloys", IEEE Transactions on Magnetics, vol. MAG-17, No. 6, Nov. 1981, pp 2837–2839.

Primary Examiner—Kenneth Wieder
Assistant Examiner—W. Edmonds
Attorney, Agent, or Firm—Edward W. Callan

[57] ABSTRACT

A magnetometer for detecting variations in a DC magnetic field. The magnetometer includes a magnetic field variation sensitive device that resonates at a characteristic resonant frequency by converting energy stored therein as a result of being excited by electromagnetic radiation at twice the resonant frequency when biased by a DC magnetic bias field within a predetermined field intensity range in which the amplitude of the resonance varies with variations of the field intensity. The magnetometer further includes an excitation circuit for exciting the device to resonate at the characteristic resonant frequency at an amplitude level that remains constant when the DC magnetic bias field intensity does not vary and is within the predetermined field intensity range; a DC voltage source within the excitation circuit for biasing the device with a DC magnetic bias field that is within the predetermined field intensity range; and a sensing instrument for sensing the amplitude of the resonance of the device at the characteristic resonant frequency. A variation in the amplitude of the resonance sensed by the sensing instrument indicates a variation in the intensity of the DC magnetic bias field. The magnetometer is utilized in a variety of different systems, including a system for actuating an output instrument, such as a traffic signal controller, in response to a predetermined threshold variation in a DC magnetic bias field, such as occurs when a motor vehicle moves into the vicinity of the magnetometer; a system for probing for materials whose presence affects the intensity of a DC magnetic bias field, such as buried pipes or ferromagnetic mineral deposits; a system for communicating in the low frequency range of the electromagnetic spectrum; and a system for guiding a probe with respect to the location of an object whose presence causes a variation in the intensity of a magnetic bias field.

24 Claims, 3 Drawing Sheets

ELASTIC CURVE

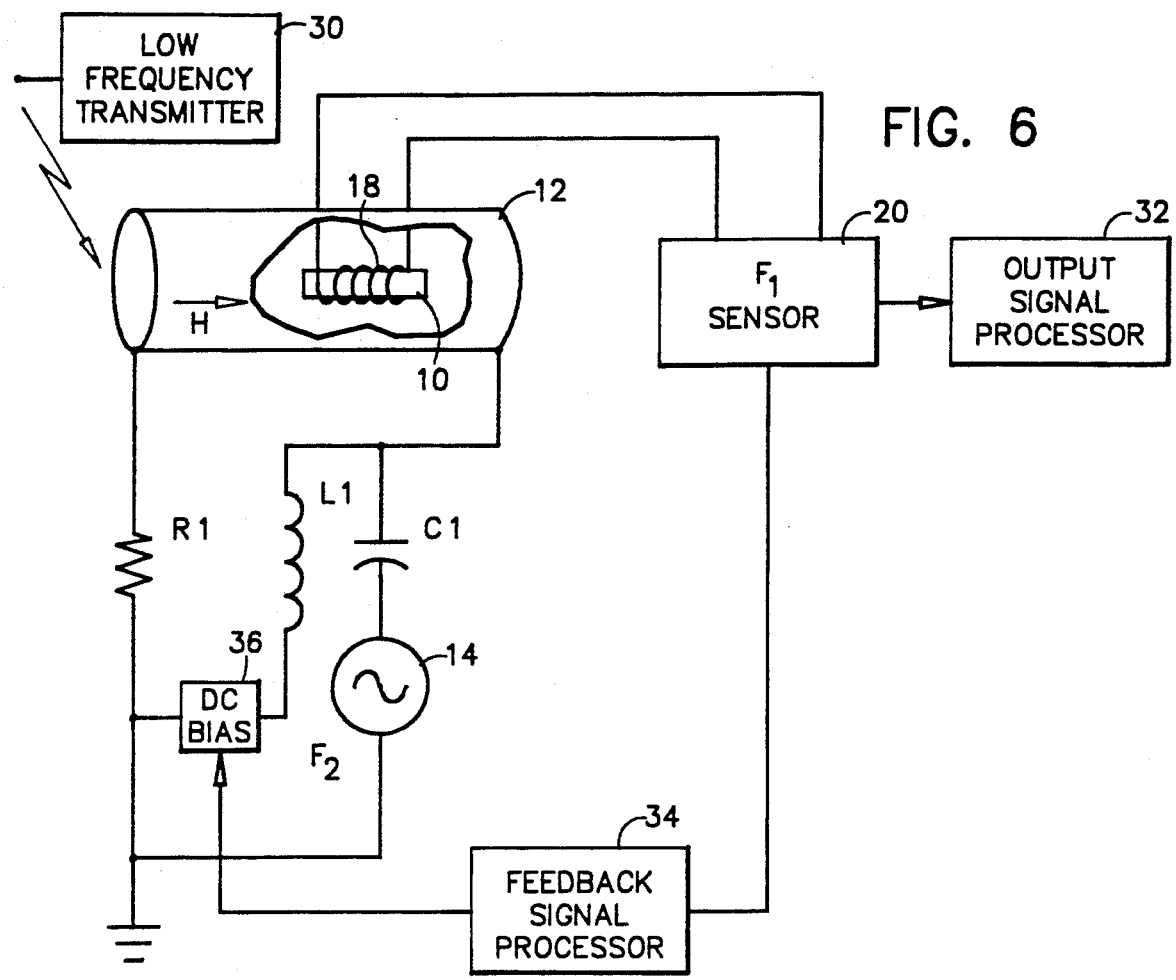
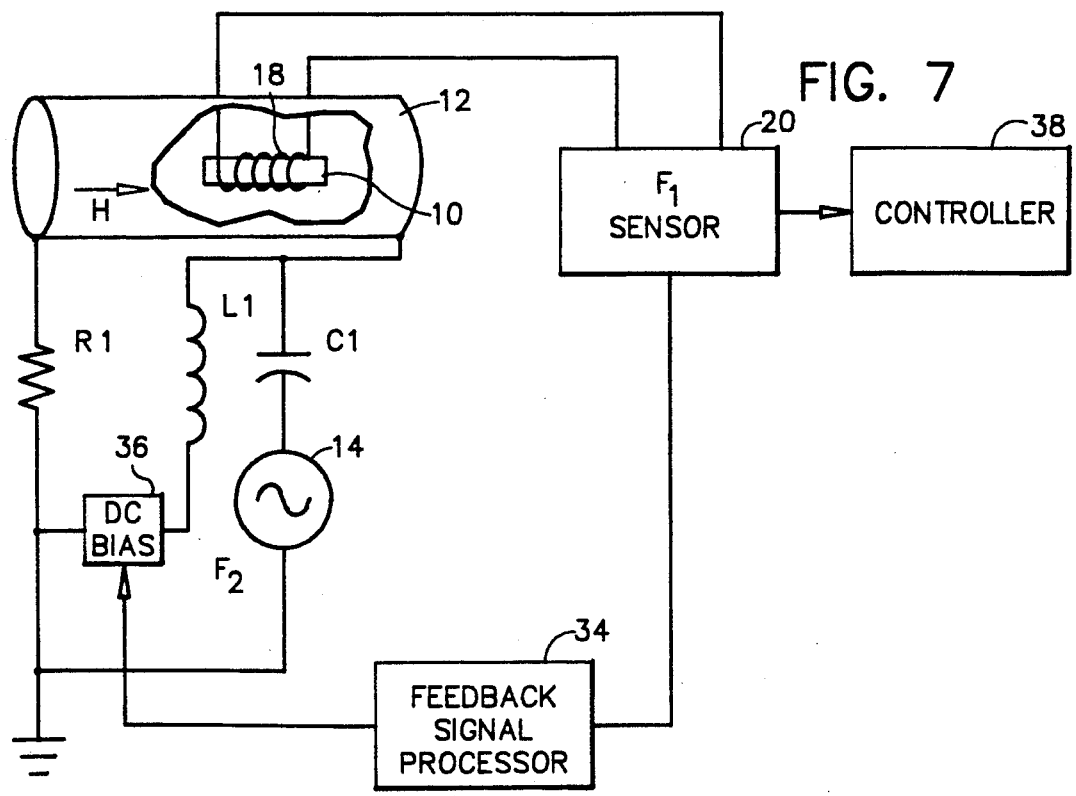

MAGNETOMETER FOR DETECTING DC MAGNETIC FIELD VARIATIONS

BACKGROUND OF THE INVENTION

The present invention generally pertains to magnetometers and is particularly directed to the use of a novel type of magnetometer for detecting variations in a DC magnetic field.

A magnetometer is an instrument for measuring the intensity or direction, or both, of a magnetic field component in a given direction.

SUMMARY OF THE INVENTION

The present invention provides a highly sensitive magnetometer for detecting variations in a DC magnetic field. The magnetometer includes a magnetic field variation sensitive device that resonates at a characteristic resonant frequency by converting energy stored therein as a result of being excited by electromagnetic radiation at twice the resonant frequency when biased by a DC magnetic bias field within a predetermined field intensity range, in which the amplitude of the resonance varies with variations of the field intensity. The magnetometer further includes an excitation circuit for exciting the device to resonate at the characteristic resonant frequency at an amplitude level that remains constant when the DC magnetic bias field intensity does not vary and is within the predetermined field intensity range; a DC voltage source within the excitation circuit for biasing the device with a DC magnetic bias field that is within the predetermined field intensity range; and a sensing instrument for sensing the amplitude of the resonance of the device at the characteristic resonant frequency. A variation in the amplitude of the resonance sensed by the sensing instrument indicates a variation in the intensity of the DC magnetic bias field.

One embodiment of the magnetic field variation sensitive device includes a ribbon of low coercivity magnetostrictive material, having a transverse uniaxial magnetic anisotropy defining a characteristic magnetomechanical resonant frequency in accordance with the dimensions of the ribbon when in the presence of the bias field within the predetermined DC magnetic field intensity range, for storing and converting the excitation energy, wherein the ribbon is excited into resonance by energy being stored therein at twice the resonant frequency.

Another embodiment of the magnetic field variation sensitive device includes an LC resonant circuit including an inductor having a core having a low coercivity nonmagnetostrictive magnetic material having a nonlinear magnetization characteristic in which the knee of the B-H curve is within the predetermined DC magnetic bias field intensity range. The LC resonant circuit is tuned to the resonant frequency for storing energy induced therein at twice the resonant frequency and for radiating the stored energy at the resonant frequency.

The magnetometer of the present invention may be utilized in a variety of different systems, including a system for actuating an output instrument, such as a traffic signal controller, in response to a predetermined threshold variation in a DC magnetic bias field, such as occurs when a motor vehicle moves into the vicinity of the magnetometer; a system for probing for materials whose presence affects the intensity of a DC magnetic bias field, such as buried pipes or ferromagnetic mineral deposits; a system for communicating in the low frequency range of the electromagnetic spectrum; and a system for guiding a probe with respect to the location of an object whose presence causes a variation in the intensity of a magnetic bias field.

Additional features of the present invention are described in relation to the description of the preferred embodiments.

BRIEF DESCRIPTION OF THE DRAWING

FIG. 6 is a partially schematic drawing of a preferred embodiment of a communication system utilizing the magetometer of the present invention.

FIG. 7 is a partially schematic drawing of a preferred embodiment of a system for guiding a probe utilizing the magnetometer of the present invention.

DESCRIPTION OF THE PREFERRED EMBODIMENTS

Figure 1:
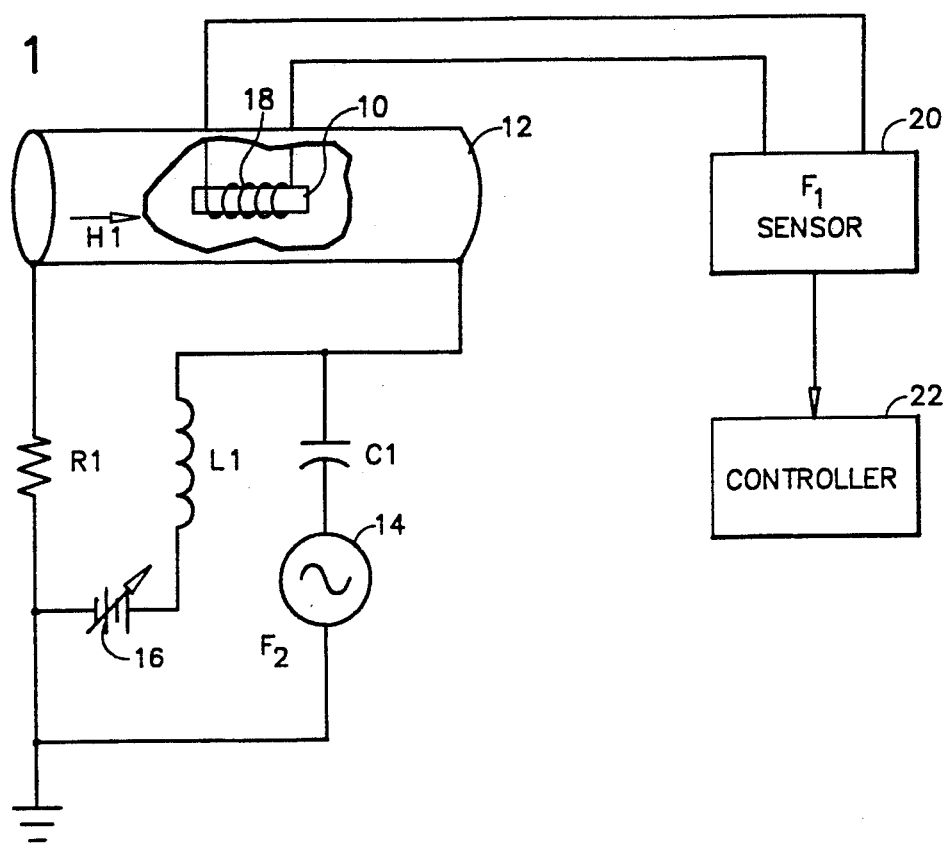
FIG. 1 is a partially schematic drawing of a preferred embodiment of of the magnetometer of the present invention connected to an output instrument.

Referring to FIG. 1, a preferred embodiment of the magnetometer of the present invention includes a DC magnetic field sensitive device 10 in the form of a ribbon 10 of low coercivity magnetostrictive material having a transverse magnetic anisotropy defining a characteristic magnetomechanical resonant frequency in accordance with the dimensions of the ribbon when in the presence of a DC magnetic bias field within a predetermined field intensity range in which the amplitude of the resonance varies with variations of the DC field. Magnetostrictive materials are also sometimes known as magnetoelastic materials. The ribbon 10 resonates at a characteristic resonant frequency f1 by converting energy stored therein as a result of being excited by electromagnetic radiation at twice the resonant frequency when biased by a DC magnetic bias field within the predetermined field intensity range described above. In this embodiment, the resonant frequency f1 is 18 kHz.

Ribbon materials that exhibit this frequency-division characteristic include $Fe_{67}Co_{18}B_{14}Si_1$, $Fe_{81}B_{13.5}Si_{3.5}C_2$ and $Fe_{40}Ni_{38}Mo_4B_{18}$ which are sold by Allied-Signal Inc. of Morristown, N.J. as METGLAS 2605CO, METGLAS 2605SC and METGLAS 2826MB, respectively. METGLAS is a trademark of Allied-Signal Inc. It is believed that $Fe_{82}B_{12}Si_6$ and $Fe_{78}B_{13}Si_{19}$ also exhibit this frequency-division characteristic.

The ribbon 10 is an elongated thin flat ribbon that has a transverse uniaxial magnetic anisotropy as a result of having been annealed in a magnetic field that is transverse to the length of the ribbon and in the plane of the ribbon. Prior to annealing, the ribbon material was cut into a long narrow strip so that demagnetizing effects are very small. The ribbon was dimensioned in accordance with a desired resonant frequency, which dimensions may be determined empirically. The ribbon then was annealed in a transverse magnetic field of approximately 5000 Oersteds for ten minutes at approximately 394 degrees Centigrade. The ribbon then was allowed to cool to the ambient temperature with the 5000 Oersted field still applied.

Figure 2:
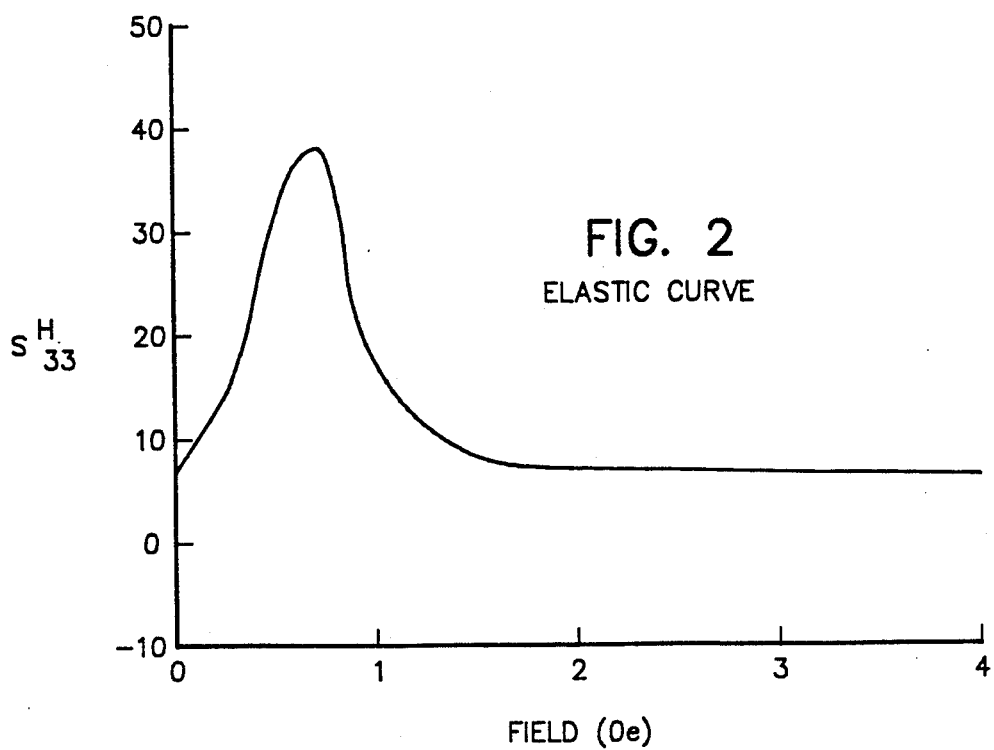
FIG. 2 is an elastic curve for a material useful as a DC magnetic field sensitive device in a preferred embodiment of the present invention.

This ribbon material exhibits this frequency-division characteristic when the DC magnetic field applied to the ribbon is within the field intensity range corresponding to the peak portion of the elastic curve for the ribbon material. This peak is seen in the elastic curve for METGLAS 2605SC material, which is reproduced in FIG. 2 of the drawing.

Figure 3:
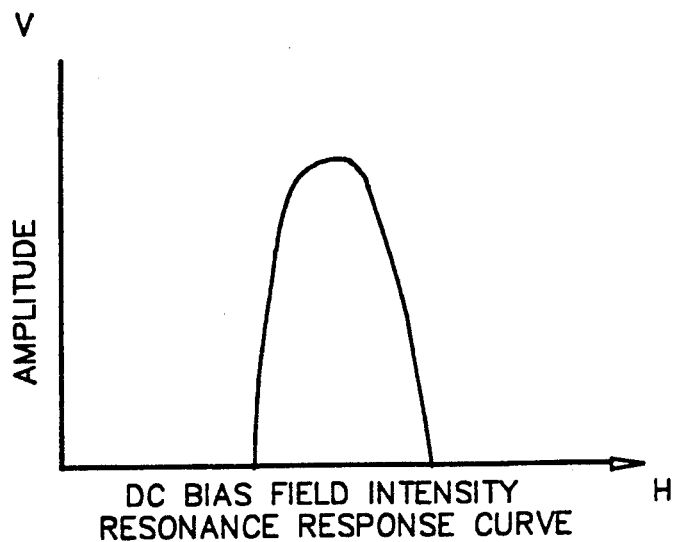
FIG. 3 is a resonance response curve for a material useful as a DC magnetic field sensitive device in a preferred embodiment of the present invention.

A characteristic resonance-response curve for the ribbon material within the range in which the frequency-division characteristic is present is shown in FIG. 3; wherein it is seen that the amplitude V of a voltage induced in a sense coil wrapped around the ribbon at the characteristic magnetomechanical resonant frequency of the ribbon material varies in accordance with variations in the intensity H of the DC magnetic bias field applied to the ribbon material. The H-axis scale and range of FIG. 3 do not correspond to the H-axis scale and range of FIG. 2.

Referring again to FIG. 1, the magnetometer further includes a circuit for exciting the ribbon 10 into resonance and means for sensing such resonance. The excitation circuit includes a solenoid 12, an AC signal generator 14, a resistor R1, an inductor L1 and a capacitor C1. The AC signal generator 14 provides a signal at a frequency f2, which is twice the magnetomechanical resonant frequency f1 of the ribbon 10 and applies such signal to the solenoid 12 so as to produce a field of electromagnetic radiation H at twice the resonant frequency within the solenoid 12. The ribbon 10 is positioned axially within the solenoid 12. The ribbon 10 is mounted in a housing (not shown) that enables the ribbon 10 to vibrate freely without any restriction being impressed on the ribbon by the housing.

The signal at the frequency f2 applied to the solenoid 12 by the excitation circuit is biased by a DC voltage bias source 16 so as to induce a DC magnetic bias field component within the solenoid 12. The bias source 16 is adjustable and is adjusted to set a DC magnetic bias field level within the solenoid, which when combined with any ambient DC magnetic field, biases the ribbon 10 within the predetermined range of DC magnetic field intensity in which the ribbon exhibits frequency-division behavior as shown in the resonance response curve of FIG. 3. Alternatively, the DC magnetic bias field may be produced by a permanent magnet (not shown) disposed a predetermined distance from the ribbon 10. intensity range, electromagnetic radiation radiated within the solenoid 12 at twice the resonant frequency is induced in the ribbon 10, stored in the ribbon 10 and then transmitted as electromagnetic energy at the resonant frequency f1. The AC component of the electromagnetic radiation provided inside the solenoid 12 by the excitation circuit is maintained constant so that the amplitude of the resonance by the ribbon 10 remains constant when the DC field intensity within the solenoid 12 does not vary within the predetermined DC magnetic bias field intensity range.

Resonance of the ribbon 10, as exhibited by electromagnetic radiation transmitted by the ribbon 10 at the characteristic magnetomechanical resonant frequency f1, is sensed by a coil 18 wrapped around the ribbon 10 and a sensing instrument 20 connected to the ribbon 10 and turned to the resonant frequency f1 for sensing the amplitude of the resonance. A variation in the amplitude of the resonance at the frequencey f1 sensed by the sensing instrument 20 indicates a variation in the intensity of the DC magnetic field that is biasing the ribbon 10.

Referring again to the resonance-response curve of FIG. 3, it is seen that the ribbon 10 has a resonance-amplitude-versus-field intensity characteristic defined by an increasing resonance amplitude, a peak and then a decreasing resonance amplitude within the predetermined field intensity range in which frequency division is exhibited by the ribbon 10. To avoid confusion as to the meaning of sensed variations in the amplitude of radiation transmitted by the ribbon 10 at the resonant frequency f1, the DC bias source 16 is adjusted to bias the ribbon 10 within a linear region of either the decreasing-resonance-amplitude portion or the increasing-resonance-amplitude portion of the predetermined field intensity range. It is noted that the slope of the decreasing-resonance-amplitude portion is not as steep as the slope of the increasing-resonance-amplitude portion, whereby one portion or the other may be selected in accordance with the degree of sensitivity desired.

In an alternative preferred embodiment, an LC resonant circuit is substituted for the ribbon 10 as the DC magnetic field sensitive device in the magnetometer shown in FIG. 1. Such a substition is illustrated in FIG. 4, wherein the LC circuit is shown within the interior of the solenoid 12.

Figure 4:
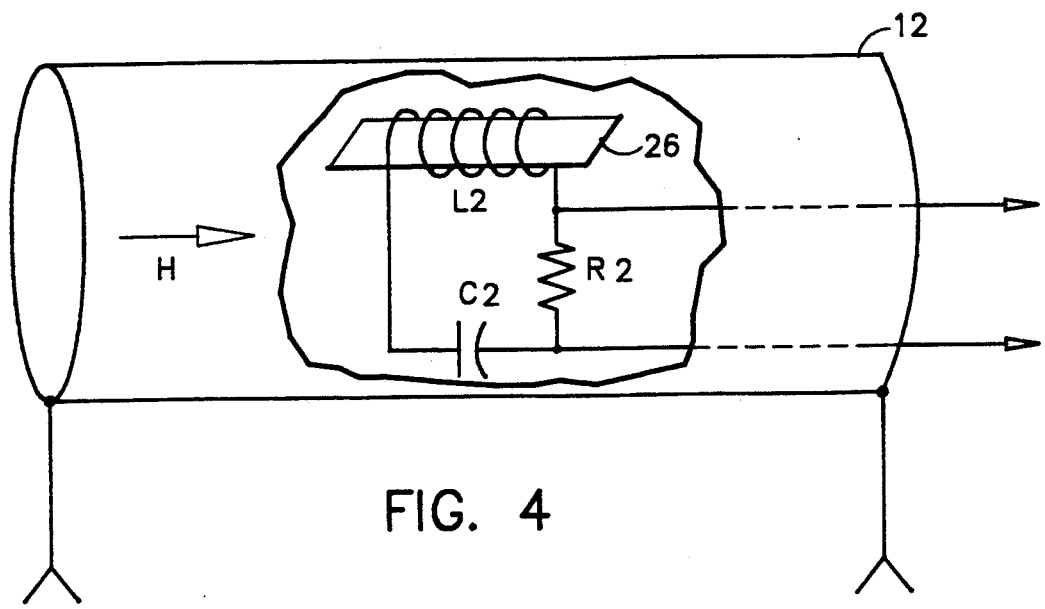
FIG. 4 is an alternative embodiment of a DC magnetic field sensitive device that may be used in the magnetometer of the present invention.

The LC resonant circuit of FIG. 4 includes a capacitance C2 and an inductor L2 having a core 26 having a low coercivity nonmagnetostrictive magnetic material having a magnetization characteristic in which the knee of the B-H curve is within a predetermined magnetic field intensity range in which the LC resonant circuit resonates at a characteristic resonant frequency by converting energy stored therein as a result of being excited at twice the resonant frequency. When the LC resonant circuit is tuned to such characteristic resonant frequency, it stores energy induced therein at twice the resonant frequency and radiates the stored energy at the resonant frequency.

A suitable inductor core material is an amorphous magnetic alloy known as METGLAS 2714A sold by Allied-Signal Inc. Although the core 26 is shown in FIG. 4 as a flat ribbon, the core need not be flat.

The amplitude of the resonance of the LC circuit at the resonant frequency f1 is sensed by a resistor R2 in the LC circuit and the sensing instrument 20 connected across the resistor R2 and tuned to the resonant frequency f1. Alternative to the resistor R2, a sensing coil (not shown) may be wrapped around the inductor L2 and connected to the sensing instrument 20 in the same manner as the sensing coil 18 is wrapped around the ribbon 10 and connected to the sensing instrument 20 in the embodiment of FIG. 1.

In other respects, the magnetometer of this embodiment is constructed as described above with reference to FIG. 1.

Figure 5:
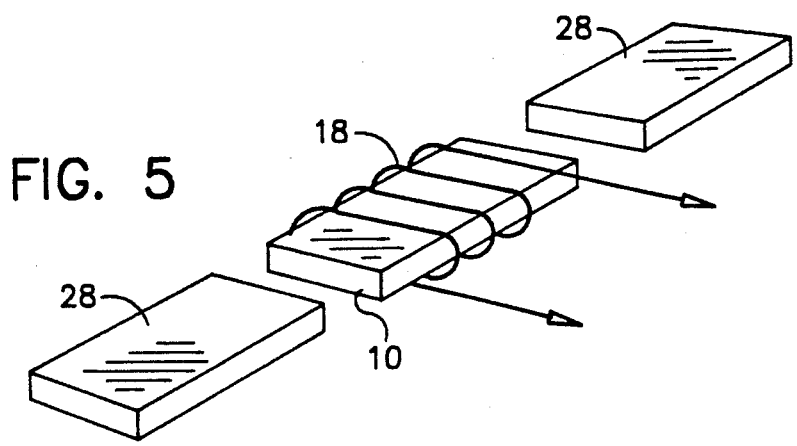
FIG. 5 illustrates flux concentrators in combination with a ribbon of low coercivity magnetostrictive material used in a DC magnetic field sensitive device.

Referring to FIG. 5, the magnetometer also may include flux concentrators 28 for concentrating flux in the ribbon 10. The flux concentrators 28 are made of a ferromagnetic material such as permalloy. Flux concentrators similarly may be used to concentrate flux in the core 26 of the inductor L2 in the LC resonant circuit of FIG. 4.

There are several useful applications for the magnetometer of the present invention.

The magnetometer can be used in a system for actuating an output instrument in response to a predetermined threshold variation in a DC magnetic bias field. An example thereof is a system for actuating a traffic signal controller in response to a variation in the DC magnetic bias field caused by a vehicle having significant ferromagnetic material entering the vicinity of the magnetometer to distort the bias field within the solenoid 12 of the magnetometer. In such a system an output instrument 22, such as a traffic signal controller, is connected to the sensing instrument 20. The output instrument 22 includes an internal circuit which actuates the traffic signal controller in response to the sensing instrument 20 sensing a predetermined variation in the amplitude of resonance corresponding to a predetermined threshold variation in the intensity of the DC magnetic bias field associated with a vehicle of a given ferromagnetic material mass entering the vicinity of the magnetometer. The magnetometer of the present invention is of small size and may conveniently be buried beneath the pavement in the approach to an intersection.

The magnetometer of the present invention also may be used in a system for probing for materials whose presence affects the intensity of a DC magnetic bias field, such as buried pipes or ferromagnetic mineral deposits. In such a system, the DC-magnetic-field-variation-sensitive ribbon 10 serves as a portable probe. The excitation circuit also necessarily is packaged with the probe. The sensing instrument 20 may be located remote from the probe if desired. An output instrument 22 (FIG. 1) is connected to the sensing instrument 20 for detecting the presence of an object material whose presence affects the intensity of the DC magnetic bias field, in response to the sensing instrument 20 sensing a predetermined variation in the amplitude of the sensed resonance corresponding to a variation in the intensity of the DC magnetic bias field in the vicinity of the probe.

The magnetometer of the present invention also is useful in a system for communicating in the low frequency range of the electromagnetic spectrum. Such a system, as shown in FIG. 6, includes a low frequency transmitter 30 and an output signal processor 32 in addition to the magnetometer. The magnetometer is modified from that described with reference to FIG. 1 by addition of a feedback signal processor 34 and a variable DC bias voltage source 36 that is varied automatically by the feedback signal processor 34.

The transmitter 30 transmits a communication signal in the low frequency range of the elecromagnetic spectrum, such as from 3 to 300 Hz.

The ribbon 10 of the magnetometer functions as a receiving device since the low frequency variations of the communication signal induce corresponding low frequency variations in the DC magnetic bias field within the solenoid 12 and thereby cause the amplitude of the characteristic resonant frequency signal sensed by the sensing instrument 20 to vary at the same low frequency rate. Consequently, a low frequency digital signal transmitted by the transmitter 30 is sensed by the sensing instrument 20 and passed to the output signal procesor 32. The output signal processor 32 detects and processes the low frequency digital communication signal in response to the variations in the amplitude of the characteristic resonant frequency signal sensed by the sensing instrument 20 in the low frequency range caused by variations in the intensity of the DC magnetic bias field caused by transmission of the low frequency digital communication signal to the ribbon 10.

The feedback signal processor 34 is connected to the sensing instrument 20 and the variable DC bias voltage source 34 for causing the variable bias voltage source 36 to vary the set DC magnetic bias field in response to variations in the amplitude of the resonance sensed by the sensing instrument 20 so as to maintain the DC magnetic bias field within the solenoid 12 within a predetermined linear portion of the predetermined DC magnetic bias field intensity range notwithstanding variations in the intensity of the ambient DC magnetic field caused by relative movement of the recieving device (ribbon) 10 with respect to the transmitter 30.

The magnetometer of the present invention also may be used in a system for guiding a probe with respect to the location of an object whose presence causes a variation in the intensity of a DC magnetic bias field, as shown in FIG. 7. In this embodiment, the probe includes the ribbon 10 and the magnetometer is the same as the magnetometer described above with reference to FIG. 6. The system further includes a controller 38 for guiding the probe in response to sensed predetermined variations in the amplitude of the signal at the characteristic resonant frequency sensed by the sensing instrument 20 corresponding to predetermined variations in the intensity of the DC magnetic bias field caused by the movement of the probe with respect to the object.

The feedback signal processor 34 is connected to the sensing instrument 20 and the variable DC bias voltage source 34 for causing the variable bias voltage source 36 to vary the set DC magnetic bias field in response to variations in the amplitude of the resonance sensed by the sensing instrument 20 so as to maintain the DC magnetic bias field of the probe within a predetermined linear portion of the predetermined DC magnetic bias field intensity range notwithstanding variations in the intensity of the ambient DC magnetic field caused by the probe being guided closer to or away from the object.

In each of the system embodiments described above with reference to FIGS. 1, 6 and 7, the LC resonant circuit of FIG. 4 may be substituted for the ribbon 10 as the DC-magnetic-field-variation-sensitive device.

We claim:
1. A magnetometer, comprising
   a device that resonates at a characteristic resonant frequency by converting energy stored therein as a result of being excited by electromagnetic radiation at twice the resonant frequency when biased by a DC magnetic field within a predetermined field intensity range in which the amplitude of said resonance varies with variations of the DC magnetic bias field intensity;
   means for biasing the device with a DC magnetic field that is within said predetermined field intensity range;
   means for exciting the device to resonate at said characteristic resonant frequency at an amplitude level that remains constant when the DC magnetic bias field intensity does not vary and is within said predetermined field intensity range; and
   means for sensing the amplitude of resonance of the device at the characteristic resonant frequency;
   whereby a variation in the amplitude of the resonance sensed by the sensing means indicates a variation in the intensity of the DC magnetic bias field.

2. A magnetometer according to claim 1, wherein the device has a resonance-amplitude-versus-field-intensity characteristic defined by an increasing resonance amplitude, a peak, and then a decreasing resonance amplitude within the predetermined field intensity range; and wherein the biasing means bias the device with a DC magnetic field that is in the decreasing-resonance-amplitude portion of the predetermined field intensity range.

3. A magnetometer according to claim 1, wherein the device has a resonance-amplitude-versus-field-intensity characteristic defined by an increasing resonance amplitude, a peak, and then a decreasing resonance amplitude within the predetermined field intensity range; and wherein the biasing means bias the device with a DC magnetic field that is in the increasing-resonance-amplitude portion of the predetermined field intensity range.

4. A magnetometer according to claim 1, wherein the device includes a ribbon of low coercivity magnetostrictive material, having a transverse uniaxial magnetic anisotropy defining a characteristic magnetomechanical resonant frequency in accordance with the dimensions of the ribbon when in the presence of said bias field within said predetermined DC magnetic field intensity range, for storing and converting said excitation energy, wherein the ribbon is excited into resonance by energy being induced therein at twice the resonant frequency.

5. A magnetometer according to claim 4, wherein the exciting means include means for radiating electromagnetic radiation at twice the resonant frequency to induce enegry in the ribbon at twice the resonant frequency;

wherein the ribbon stores the energy induced therein by the exciting electromagnetic radiation and transmits said stored energy as electromagnetic radiation at the resonant frequency; and wherein the sensing means includes means for sensing electromagnetic radiation at the resonant frequency.

6. A magnetometer according to claim 5, further comprising means for concentrating flux in the ribbon.

7. A magnetometer according to claim 1, wherein the biasing means sets a DC magnetic bias field intensity level which, when combined with any ambient DC magnetic field biases the device with a DC magnetic bias field that is within the predetermined range, the magnetometer further comprising feedback means connected to both the biasing means and the sensing means for causing the biasing means to vary the set DC magnetic field intensity level in response to variations in the sensed resonance amplitude to maintain the DC magnetic field bias of the device within a predetermined portion of the predetermined field intensity range notwithstanding variations in the intensity of the ambient DC magnetic field.

8. A magnetometer according to claim 1, wherein the device includes an LC resonant circuit including an inductor having a core having a low coercivity non-magnetostrictive magnetic material having a magnetization characteristic in which the knee of the B-H curve is within the predetermined field intensity range, the LC resonant circuit being tuned to the resonant frequency for storing energy induced in the circuit at twice the resonant frequency and for radiating the stored energy at the resonant frequency.

9. A system according to claim 8, wherein the exciting means include means for radiating electromagnetic radiation at twice the resonant frequency to induce enegry in the LC resonant circuit at twice the resonant frequency; and wherein the sensing means includes means for sensing electromagnetic radiation at the resonant frequency.

10. A magnetometer according to claim 9, further comprising means for concentrating flux in the core.

11. A system for actuating an output instrument in response to a predetermined threshold variation in a DC magnetic bias field, comprising a device that resonates at a characteristic resonant frequency by converting energy stored therein as a result of being excited by electromagnetic radiation at twice the resonant frequency when biased by a DC magnetic field within a predetermined field intensity range in which the amplitude of said resonance varies with variations of the DC magnetic bias field intensity;

means for biasing the device with a DC magnetic bias field that is within said predetermined field intensity range;

means for exciting the device to resonate at said characteristic resonant frequency at an amplitude level that remains constant when the DC magnetic bias field intensity does not vary and is within said predetermined field intensity range;

means for sensing the amplitude of resonance of the device at the characteristic resonant frequency, whereby a variation in the amplitude of the resonance sensed by the sensing means indicates a variation in the intensity of the DC magnetic bias field; and means for actuating an output instrument in response to the sensing means sensing a predetermined variation in the amplitude of resonance corresponding to a predetermined threshold variation in the DC magnetic bias field.

12. A system according to claim 11, wherein the device includes a ribbon of low coercivity magnetostrictive material, having a transverse uniaxial magnetic anisotropy defining a characteristic magnetomechanical resonant frequency in accordance with the dimensions of the ribbon when in the presence of said bias field within said predetermined DC magnetic field intensity range, for storing and converting said excitation energy, wherein the ribbon is excited into resonance by energy being induced therein at twice the resonant frequency;

wherein the exciting means include means for radiating electromagnetic radiation at twice the resonant frequency to induce energy in the ribbon at twice the resonant frequency;

wherein the ribbon stores the energy induced therein by the exciting electromagnetic radiation and transmits said stored energy as electromagnetic radiation at the resonant frequency; and wherein the sensing means includes means of sensing electromagnetic radiation at the resonant frequency.

13. A system according to claim 11, wherein the device includes an LC resonant circuit including an inductor having a core having a low coercivity non-magnetostrictive magnetic material having a magnetization characteristic in which the knee of the B-H curve is within the predetermined field intensity range, the LC resonant circuit being tuned to the resonant frequency for storing energy induced in the circuit at twice the resonant frequency and for radiating the stored energy at the resonant frequency;

wherein the exciting means include means for radiating electromagnetic radiation at twice the resonant frequency to induce enegry in the LC resonant circuit at twice the resonant frequency; and wherein the sensing means includes means for sensing electromagnetic radiation at the resonant frequency.

14. A system for probing for object materials whose presence affects the intensity of a DC magnetic bias field, comprising a probe that resonates at a characteristic resonant frequency by converting energy stored therein as a result of being excited by electromagnetic radiation at twice the resonant frequency when biased by a DC magnetic bias field within a predetermined field intensity range in which the amplitude of said resonance varies with variations of the DC magnetic bias field intensity;

means for biasing the probe with a DC magnetic bias field that is within said predetermined field intensity range;

means for exciting the probe to resonate at said characteristic resonant frequency at an amplitude level that remains constant when the DC magnetic bias field intensity does not vary and is within said predetermined field intensity range;

means for sensing the amplitude of resonance of the probe at the characteristic resonant frequency, whereby a variation in the amplitude of the resonance sensed by the sensing means indicates a variation in the intensity of the DC magnetic bias field; and means for detecting the presence of an object material whose presence affects the intensity of a DC magnetic bias field, in response to the sensing means sensing a predetermined variation in the amplitude of resonance corresponding to a variation in the intensity of the DC magnetic bias field in the vicinity of the probe.

15. A system according to claim 14, wherein the probe includes a ribbon of low coercivity magnetostrictive material, having a transverse uniaxial magnetic anisotropy defining a characteristic magnetomechanical resonant frequency in accordance with the dimensions of the ribbon when in the presence of said bias field within said predetermined DC magnetic field intensity range, for storing and converting said excitation energy, wherein the ribbon is excited into resonance by energy being induced therein at twice the resonant frequency;

wherein the exciting means include means for radiating electromagnetic radiation at twice the resonant frequency to induce energy in the ribbon at twice the resonant frequency;

wherein the ribbon stores the energy induced therein by the exciting electromagnetic radiation and transmits said stored energy as electromagnetic radiation at the resonant frequency; and wherein the sensing means includes means for sensing electromagnetic radiation at the resonant frequency.

16. A system according to claim 14, wherein the probe includes an LC resonant circuit including an inductor having a core having a low coercivity non-magnetostrictive magnetic material having a magnetization characteristic in which the knee of the B-H curve is within the predetermined field intensity range, the LC resonant circuit being tuned to the resonant frequency for storing energy induced in the circuit at twice the resonant frequency and for radiating the stored energy at the resonant frequency;

wherein the exciting means include means for radiating electromagnetic radiation at twice the resonant frequency to induce enegry in the LC resonant circuit at twice the resonant frequency; and wherein the sensing means includes means for sensing electromagnetic radiation at the resonant frequency.

17. A system for guiding a probe with respect to the location of an object whose presence affects the intensity of a DC magnetic bias field, comprising a probe that resonates at a characteristic resonant frequency by converting energy stored therin as a result of being excited by electromagnetic radiation at twice the resonant frequency when biased by a DC magnetic bias field within a predetermined field intensity range in which the amplitude of said resonance varies with variations of the DC magnetic bias field intensity;

means for biasing the probe with a DC magnetic bias field that is within said predetermined field intensity range;

means for exciting the probe to resonate at said characteristic resonant frequency at an amplitude level that remains constant when the DC magnetic bias field intensity does not vary and is within said predetermined field intensity range;

means for sensing the amplitude of resonance of the probe at the characteristic resonant frequency, whereby a variation in the amplitude of the resonance sensed by the sensing means indicates a variation in the intensity of the DC magnetic bias field; and means for guiding the probe in response to sensed predetermined variations in the amplitude of resonance corresponding to predetermined variations in the intensity of the DC magnetic bias field caused by the movement of the probe with respect to an object whose presence affects the intensity of the DC magnetic bias field.

18. A system according to claim 17, wherein the probe includes a ribbon of low coercivity magnetostrictive material, having a transverse uniaxial magnetic anisotropy defining a characteristic magnetomechanical resonant frequency in accordance with the dimensions of the ribbon when in the presence of said bias field within said predetermined DC magnetic field intensity range, for storing and converting said excitation energy, wherein the ribbon is excited into resonance by energy being induced therein at twice the resonant frequency;

wherein the exciting means include means for radiating electromagnetic radiation at twice the resonant frequency to induce energy in the ribbon at twice the resonant frequency;

wherein the ribbon stores the energy induced therein by the exciting electromagnetic radiation and transmits said stored energy as electromagnetic radiation at the resonant frequency; and wherein the sensing means includes means for sensing electromagnetic radiation at the resonant frequency.

19. A system according to claim 17, wherein the probe includes an LC resonant circuit including an inductor having a core having a low coercivity nonmagnetostrictive magnetic material having a magnetization characteristic in which the knee of the B-H curve is within the predetermined field intensity range, the LC resonant circuit being tuned to the resonant frequency for storing energy induced in the circuit at twice the resonant frequency and for radiating the stored energy at the resonant frequency;

wherein the exciting means include means for radiating electromagnetic radiation at twice the resonant frequency to induce enegry in the LC resonant circuit at twice the resonant frequency; and wherein the sensing means includes means for sensing electromagnetic radiation at the resonant frequency.

20. A system according to claim 17, wherein the biasing means sets a DC magnetic bias field intensity level which, when combined with any ambient DC magnetic field, biases the probe with a DC magnetic bias field that is within the predetermined range, the system further comprising feedback means connected to both the biasing means and the sensing means for causing the biasing means to vary the set DC magnetic field intensity level in response to variations in the sensed resonance amplitude to maintain the DC magnetic field bias of the probe within a predetermined portion of the the predetermined field intensity range notwithstanding variation in the intensity of the ambient DC magnetic field caused by the probe being guided closer to or away from said object.

21. A system for communicating in the low frequency range of the electromagnetic spectrum, comprising means for transmitting a communication signal in the low frequency range of the electromagnetic spectrum;

a receiving device within the range of the transmitted communication signal that resonates at a characteristic resonant frequency by converting energy stored therein as a result of being excited by electromagnetic radiation at twice the resonant frequency when biased by a DC magnetic field within a predetermined field intensity range in which the amplitude of said resonance varies with variations of the DC magnetic bias field intensity;

means for biasing the device with a DC magnetic bias field that is within said predetermined field intensity range;

means for exciting the device to resonate at said characteristic resonant frequency at an amplitude level that remains constant when the DC magnetic bias field intensity does not vary and is within said predetermined field intensity range;

means for sensing the amplitude of resonance of the device at the characteristic resonant frequency, whereby a variation in the amplitude of the resonance sensed by the sensing means indicates a variation in the intensity of the DC magnetic bias field; and means for detecting and processing the communication signal in response to variations in the amplitude of resonance sensed by the sensing means in the low frequency range caused by low frequency variations in the intensity of the DC magnetic bias field induced by low frequency variations in the communication signal.

22. A system according to claim 21, wherein the receiving device includes a ribbon of low coercivity magnetostrictive material, having a transverse uniaxial magnetic anisotropy defining a characteristic magnetomechanical resonant frequency in accordance with the dimensions of the ribbon when in the presence of said bias field within said predetermined DC magnetic field intensity range, for storing and converting said excitation energy, wherein the ribbon is excited into resonance by energy being induced therein at twice the resonant frequency;

wherein the exciting means include means for radiating electromagnetic radiation at twice the resonant frequency to induce energy in the ribbon at twice the resonant frequency;

wherein the ribbon stores the energy induced therein by the exciting electromagnetic radiation and transmits said stored energy as electromagnetic radiation at the resonant frequency; and wherein the sensing means includes means for sensing electromagnetic radiation at the resonant frequency.

23. A system according to claim 21, wherein the receiving device includes an LC resonant circuit including an inductor having a core having a low coercivity nonmagnetostrictive magnetic material having a magnetization characteristic in which the knee of the B-H curve is within the predetermined field intensity range, the LC resonant circuit being tuned to the resonant frequency for storing energy induced in the circuit at twice the resonant frequency and for radiating the stored energy at the resonant frequency;

wherein the exciting means include means for radiating electromagnetic radiation at twice the resonant frequency to induce enegry in the LC resonant circuit at twice the resonant frequency; and wherein the sensing means includes means for sensing electromagnetic radiation at the resonant frequency.

24. A system according to claim 21, wherein the biasing means sets a DC magnetic bias field intensity level which, when combined with any ambient DC magnetic field, biases the receiving device with a DC magnetic field that is within the predetermined range, the system further comprising feedback means connected to both the biasing means and the sensing means for causing the biasing means to vary the set DC magnetic field intensity level in response to variations in the sensed resonance amplitude to maintain the DC magnetic bias field of the receiving device within a predetermined portion of the predetermined field intensity range notwithstanding variations in the intensity of the ambient DC magnetic field caused by relative movement of the receiving device with respect to the transmitting means.

* * * * *

UNITED STATES PATENT AND TRADEMARK OFFICE
CERTIFICATE OF CORRECTION

PATENT NO.   :   5,015,953

DATED        :   May 14, 1991

INVENTOR(S)  :   Lucian G. Ferguson and Lincoln H. Charlot, Jr.

It is certified that error appears in the above-identified patent and that said Letters Patent is hereby corrected as shown below:

Column 3, line 53, before "intensity", insert --When the ribbon is biased within such predetermined DC magnetic field--.

Signed and Sealed this

Twentieth Day of October, 1992

Attest:

DOUGLAS B. COMER

Attesting Officer      Acting Commissioner of Patents and Trademarks